(12) United States Patent
Cassagnes et al.

(10) Patent No.: US 10,330,475 B2
(45) Date of Patent: Jun. 25, 2019

(54) SEGMENTED ELECTRODE STRUCTURE FOR QUADRATURE REDUCTION IN AN INTEGRATED DEVICE

(71) Applicant: NXP USA, INC., Austin, TX (US)

(72) Inventors: Thierry Cassagnes, Tournefeuille (FR); Gerhard Trauth, Muret (FR); Margaret Leslie Kniffin, Chandler, AZ (US); Aaron A. Geisberger, Austin, TX (US)

(73) Assignee: NXP USA, Inc., Austin, TX (US)

( * ) Notice: Subject to any disclaimer, the term of this patent is extended or adjusted under 35 U.S.C. 154(b) by 55 days.

(21) Appl. No.: 15/637,955

(22) Filed: Jun. 29, 2017

(65) Prior Publication Data

US 2018/0017387 A1    Jan. 18, 2018

(30) Foreign Application Priority Data

Jul. 14, 2016 (EP) .................................... 16305917

(51) Int. Cl.
*G01C 19/5726* (2012.01)
*B81C 1/00* (2006.01)
(Continued)

(52) U.S. Cl.
CPC ...... *G01C 19/5726* (2013.01); *B81C 1/00198* (2013.01); *B81C 1/00246* (2013.01);
(Continued)

(58) Field of Classification Search
CPC ............ G01C 19/5726; G01C 19/5719; G01C 19/5755; G01C 19/5769; G01C 19/5733; G01C 19/5226; B81C 1/00198; B81C 1/00246; B81B 2201/0285
USPC .............. 73/1.77, 496, 503.3, 504.04, 504.8, 73/504.12, 504.14–504.16, 504.18, 73/504.02, 504.15, 514.32
See application file for complete search history.

(56) References Cited

U.S. PATENT DOCUMENTS 6,067,858 A    5/2000  Clark et al.
7,247,246 B2   7/2007  Nasiri et al.
(Continued)

FOREIGN PATENT DOCUMENTS

DE    102011006453 A1   10/2012
EP         1873489 A1    1/2007

*Primary Examiner* — Robert R Raevis
(74) *Attorney, Agent, or Firm* — Charlene R. Jacobsen

(57) ABSTRACT

An integrated device includes a MEMS device, such as a gyroscope, having a movable mass spaced apart from a substrate, the movable mass being configured to oscillate in a drive direction relative to the substrate. The integrated device further comprises an integrated circuit (IC) die having a surface coupled with the MEMS device such that the movable mass is interposed between the substrate and the surface of the IC die. An electrode structure is formed on the surface of the IC die, the electrode structure including a plurality of electrode segments vertically spaced apart from the movable mass. Openings extend through the movable mass and the electrode segments overlie the openings. Suitably selected electrode segments can be activated to electrostatically attract the movable mass toward sense electrodes vertically spaced apart from the MEMS to reduce quadrature motion of the movable mass.

19 Claims, 8 Drawing Sheets

(51) Int. Cl.
*G01C 19/5755* (2012.01)
*G01C 19/5769* (2012.01)
*G01C 19/5733* (2012.01)

(52) U.S. Cl.
CPC ..... *G01C 19/5733* (2013.01); *G01C 19/5755* (2013.01); *G01C 19/5769* (2013.01); *B81B 2201/0285* (2013.01)

(56) References Cited

U.S. PATENT DOCUMENTS

| | | |
|---|---|---|
| 2006/0213265 A1 | 9/2006 | Weber et al. |
| 2012/0126664 A1* | 5/2012 | Ogura ................ G01C 19/5607 310/312 |
| 2012/0297874 A1* | 11/2012 | Kim ...................... G01C 19/56 73/504.12 |
| 2013/0236988 A1 | 9/2013 | Sridharamurthy et al. |
| 2013/0307096 A1 | 11/2013 | Classen et al. |

* cited by examiner

SEGMENTED ELECTRODE STRUCTURE FOR QUADRATURE REDUCTION IN AN INTEGRATED DEVICE

CROSS-REFERENCE TO RELATED APPLICATIONS

This application claims the priority under 35 U.S.C. § 119 of European patent application no. 16305917.3, filed Jul. 14, 2016 the contents of which are incorporated by reference herein.

TECHNICAL FIELD OF THE INVENTION

The present invention relates generally to the field of microelectromechanical systems (MEMS). More specifically, the present invention relates to a segmented electrode structure for quadrature reduction in a MEMS-CMOS integrated device.

BACKGROUND OF THE INVENTION

Microelectromechanical systems (MEMS) technology has achieved wide popularity in recent years, as it provides a way to make very small mechanical structures and integrate these structures with electrical devices on a single substrate using conventional batch semiconductor processing techniques. One common application of MEMS is the design and manufacture of sensor devices. MEMS sensors are widely used in applications such as automotive, inertial guidance systems, household appliances, game devices, protection systems for a variety of devices, and many other industrial, scientific, and engineering systems. One example of a MEMS sensor is a MEMS angular rate sensor. Alternatively referred to as a "gyroscope", "vibratory angular rate sensors," "vibratory rate gyroscopes," "gyroscope sensor," or "yaw rate sensor," an angular rate sensor senses angular speed or velocity around one or more axes.

In vibratory angular rate sensors, an inherent problem is the existence of undesirable interference signals, referred to as a quadrature component or quadrature error. Quadrature error is due to quadrature motion, for example, motion out-of-plane of the proof mass as it oscillates back and forth above the sense electrode. Quadrature motion can occur in vibrating angular rate sensors due to manufacturing imperfections. When present, quadrature motion creates an oscillation on the sense axis that can be confused with Coriolis acceleration and subsequently, the rotation rate. Unfortunately, quadrature error can result in offset error, reduced dynamic range, and increased noise for the device. A large quadrature error can even cause a device to rail so that the sense mass comes into contact with conductive electrodes potentially resulting in collision-related damage, such as a short.

BRIEF DESCRIPTION OF THE DRAWINGS

The accompanying figures in which like reference numerals refer to identical or functionally similar elements throughout the separate views, the figures are not necessarily drawn to scale, and which together with the detailed description below are incorporated in and form part of the specification, serve to further illustrate various embodiments and to explain various principles and advantages all in accordance with the present invention.

DETAILED DESCRIPTION

Embodiments disclosed herein include an integrated device that includes a microelectromechanical systems (MEMS) device vertically bonded with an integrated circuit (IC) die, such as a complimentary metal-oxide-semiconductor (CMOS) die, and fabrication methodology for producing the integrated device. An electrode structure is formed on a surface of the IC die facing a movable mass of the MEMS device, for example, a MEMS gyroscope. The electrode structure includes a plurality of electrode segments that are connected through routing layers on the CMOS die to a switch structure and an active circuit. The active circuit can be used to selectively activate or deactivate particular electrode segments to achieve advantageous interaction with the movable mass of the MEMS device. That is, the electrode segments can be used to apply electrostatic forces to the movable mass of the MEMS device in order to compensate for quadrature motion. Further, particular electrode segments can be activated in order to compensate for bonding misalignments between the IC die and the MEMS device. Still further, the electrode segments may be selectively activated in order to allow incremental electrostatic force increases or decreases by switching voltage bias levels on the electrode segments via the active circuit.

The instant disclosure is provided to further explain in an enabling fashion the best modes, at the time of the application, of making and using various embodiments in accordance with the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It should be understood that the use of relational terms, if any, such as first and second, top and bottom, and the like may be used herein solely to distinguish one from another entity or action without necessarily requiring or implying any actual such relationship or order between such entities or actions. Furthermore, some of the figures may be illustrated using various shading and/or hatching to distinguish the different elements produced within the various structural layers. These different elements within the structural layers may be produced utilizing current and upcoming microfabrication techniques of depositing, patterning, etching, and so forth. Accordingly, although different shading and/or hatching is utilized in the illustrations, the different elements within the structural layers may be formed out of the same material.

Figure 1:
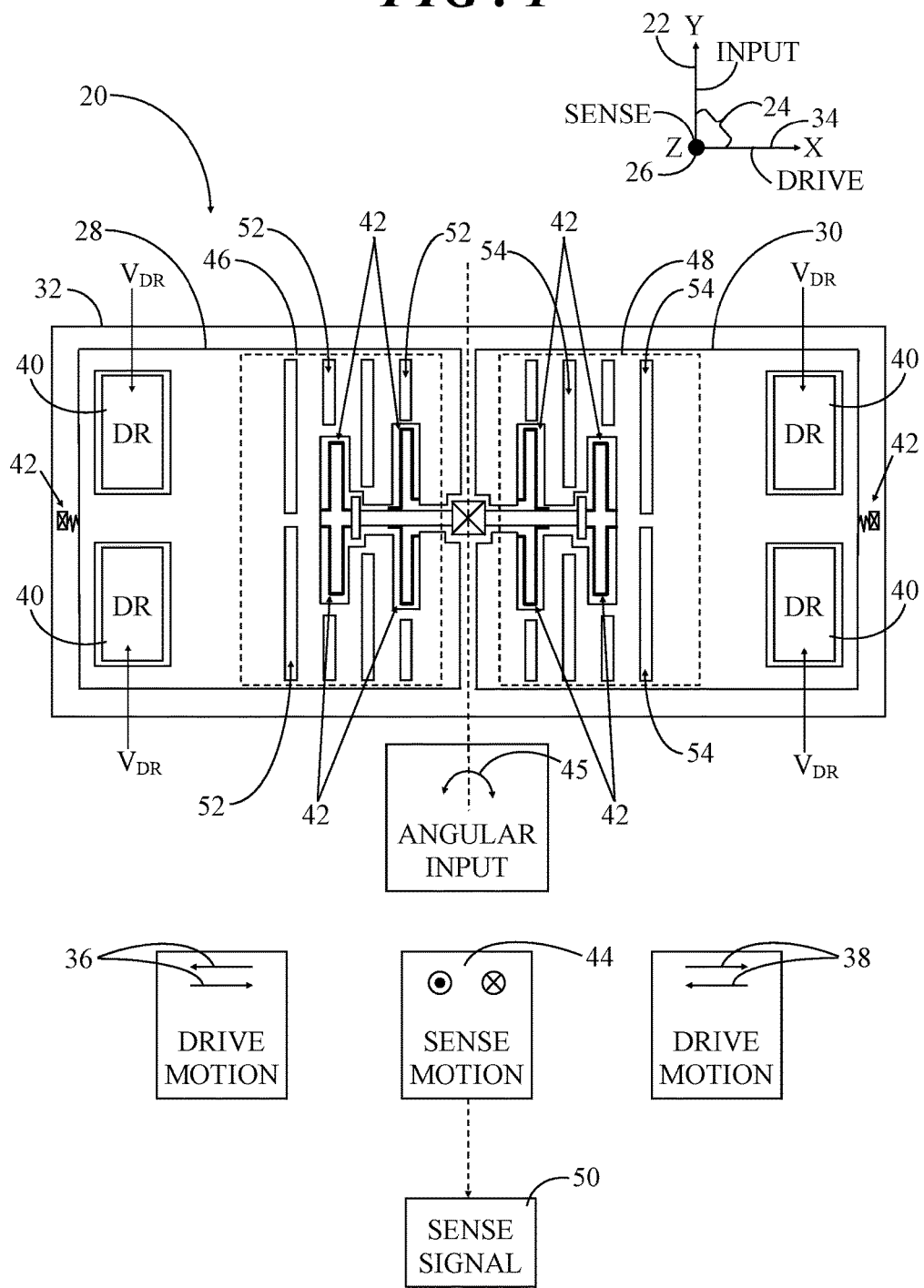
FIG. 1 shows a top view of a microelectromechanical systems (MEMS) gyroscope in a simplified and representative form.

Referring to FIG. 1, FIG. 1 shows a top view of a MEMS device 20 in a simplified and representative form. MEMS device 20 may be a vibratory rate gyroscope for sensing angular velocity about an input axis. Thus, MEMS device 20 is referred to hereinafter as gyroscope 20. Gyroscope 20 is generally configured to sense angular rate about an axis of rotation referred to as an input axis 22. In the illustrated configuration, input axis 22 is the Y-axis in a three-dimensional coordinate system. Gyroscope 20 is illustrated as having a generally planar structure within an X-Y plane 24, wherein a Z-axis 26 extends out of the page normal to X-Y plane 24.

Gyroscope 20 includes a first movable mass 28 and a second movable mass 30, each of which are adapted to oscillate back and forth above an underlying substrate 32 in a drive direction that is substantially parallel to an X-axis 34. Thus, the drive direction is orthogonal to input axis 22 of gyroscope 20. Accordingly, X-axis 34 is referred to hereinafter as drive axis 34. As indicated by the left/right set of arrows representing drive motion 36, first movable mass 28 can be configured to oscillate back and forth above substrate 32. Second movable mass 30 can be configured to oscillate back and forth above substrate 32 in a similar manner, but one hundred eighty degrees out-of-phase with first movable mass 28, as indicated generally by the right/left set of arrows representing antiphase drive motion 38. The oscillatory drive motion of first and second movable masses 28, 30 may be provided in a known manner by drive electrodes 40, generally represented by rectangles and labeled DR in FIG. 1. Although not shown in detail, drive electrodes 40 may include sets of fixed fingers coupled to substrate 32 that are interdigitated with sets of movable fingers, where the movable fingers are coupled to and extend from first and second movable masses 28, 30.

First and second movable masses 28, 30 may be supported above substrate 32 by various mechanical linkages 42 (e.g., drive and sense springs) that enable the out-of-phase oscillatory drive motion 36, 38 of first and second movable masses 28, 30 along drive axis 34. Further, mechanical linkages 42 enable sense motion 44 of first and second movable masses 28, 30 substantially parallel to Z-axis 26 in response to an angular input 45 (i.e., angular motion of gyroscope 20) about input axis 22. Hence, Z-axis 26 is referred to hereinafter as sense axis 26. A pair of sense electrodes 46, 48 can be provided on substrate 32 to detect and measure the out-of-plane deflection of first and second movable masses 28, 30. In the illustration of FIG. 1, sense electrodes 46, 48 are obscured by the overlying movable masses 28, 30. Accordingly, in FIG. 1, sense electrodes 46, 48 are represented in dashed line form to illustrate their physical placement relative to first and second movable masses 28, 30. The structural details of drive electrodes 40, mechanical linkages 42, and sense electrodes 46, 48 are not shown herein for simplicity of illustration and to avoid obscuring the exemplary and non-limiting embodiments of the invention. However, those skilled in the art will understand that drive electrodes 40, mechanical linkages 42, and sense electrodes 46, 48 can be realized in wide variety of structural configurations.

In operation, a drive voltage, $V_{DR}$, can be applied to drive electrodes 40 to produce an electrostatic force between the interdigitated drive fingers that causes the drive fingers to electrostatically move with respect to one another. The drive voltage, $V_{DR}$, may be a time-varying voltage signal adapted to alternate the charge delivered to the comb fingers, which in conjunction with mechanical linkages 42, causes first and second movable masses 28, 30 to undergo oscillatory linear motion within X-Y plane 24 in antiphase. Once first and second movable masses 28, 30 are put into oscillatory drive motion 36, 38 (antiphase) along drive axis 34, the system of masses 28, 30 is capable of detecting angular input 45, i.e., angular velocity, induced by gyroscope 20 being rotated about input axis 22. In particular, the Coriolis force resulting from rotational motion of gyroscope 20 about input axis 22 causes first and second movable masses 28, 30 to move out-of-plane with respect to sense electrodes 46, 48 as a function of the angular rate, i.e., angular input 45, of gyroscope 20 about input axis 22. This movement has an amplitude that is proportional to the angular rotation rate of gyroscope 20 about input axis 22 which can be sensed at sense electrodes 46, 48 to thereby produce a sense signal 50.

As mentioned previously, manufacturing imperfections in gyroscope 20 may permit first and second movable masses 28, 30 to undergo quadrature motion relative to sense axis 26 so that a quadrature error signal is superposed on the sense signal. In one structural configuration, first movable mass 28 may include at least one opening 52 extending through and fully encircled by the material structure of first movable mass 28. Likewise, second movable mass 30 may include at least one opening 54 extending through and fully encircled by the material structure of second movable mass 30. More particularly, first movable mass 28 includes multiple openings 52 and second movable mass 30 includes multiple openings 54. As will be discussed in significantly greater detail below, electrodes may be vertically spaced apart from each of first and second movable masses 28, 30 proximate openings 52, 54. A direct current (DC) bias voltage may be applied to the electrodes to impose an electrostatic force on first and second movable masses 28, 30 to reduce or otherwise null the quadrature motion.

Figure 2:
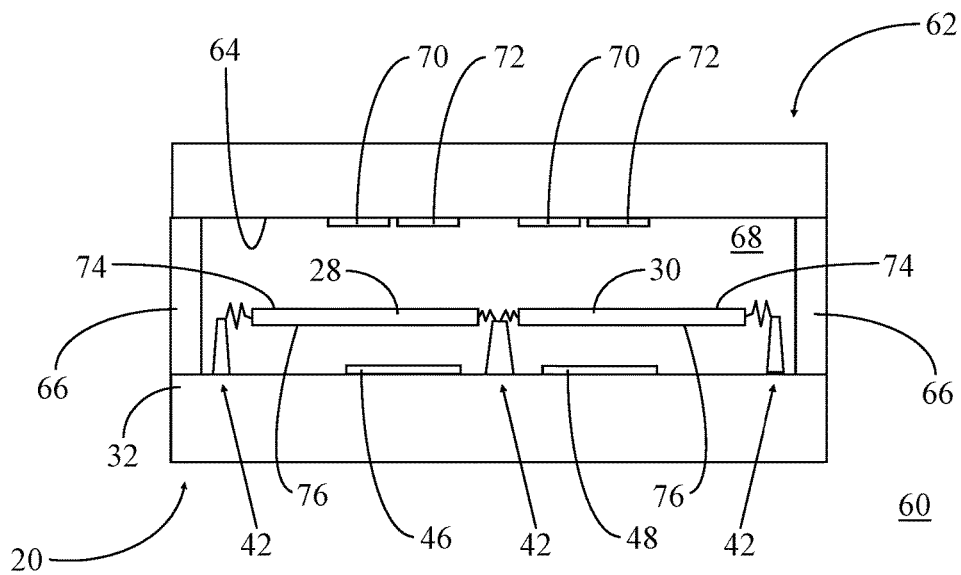
FIG. 2 shows a side view of an integrated device in a simplified and representative form.

FIG. 2 shows a side view of an integrated device 60 in a simplified and representative form. Integrated device 60 includes a MEMS device, e.g., gyroscope 20, and an integrated circuit (IC) die 62. In this example, IC die 62 may be a CMOS application specific integrated circuit (ASIC) die configured to provide the logic functions for gyroscope 20. IC die 62 has a surface 64 coupled with gyroscope 20 via, for example, spacer element 66. Spacer element 66 may fully encircle the components of gyroscope 20 and surface 64 of IC die to form a cavity 68. Electrodes 70, 72 are formed on surface 64 of IC die 62 and are vertically spaced apart from a first side 74 of each of first and second movable elements 28, 30. Sense electrodes 46, 48 are formed on substrate 32 of gyroscope 20 and are vertically spaced apart from a second side 76 of each of first and second movable elements 28, 30, in which second side 76 opposes first side 74.

Thus, first and second movable masses 28, 30 are interposed between substrate 32 of gyroscope 20 and surface 64 of IC die 62, and more particularly, first and second movable masses 28, 30, electrodes 70, 72, and sense electrodes 46, 48 are enclosed within the cavity 68 formed by coupling IC die 62 with gyroscope 20. In this theoretical configuration, electrodes 70, 72 may be utilized to bias movable masses 28, 30 so as to reduce quadrature motion. Such a configuration with electrodes 70, 72 and sense electrodes 46, 48 on opposing sides 74, 76 of first and second movable masses 28, 30, can achieve significant space savings and a reduced size relative to configurations in which electrodes 70, 72 and sense electrodes 46, 48 may be laterally disposed adjacent to one another and positioned on the same side of the movable mass(es).

Figure 3:
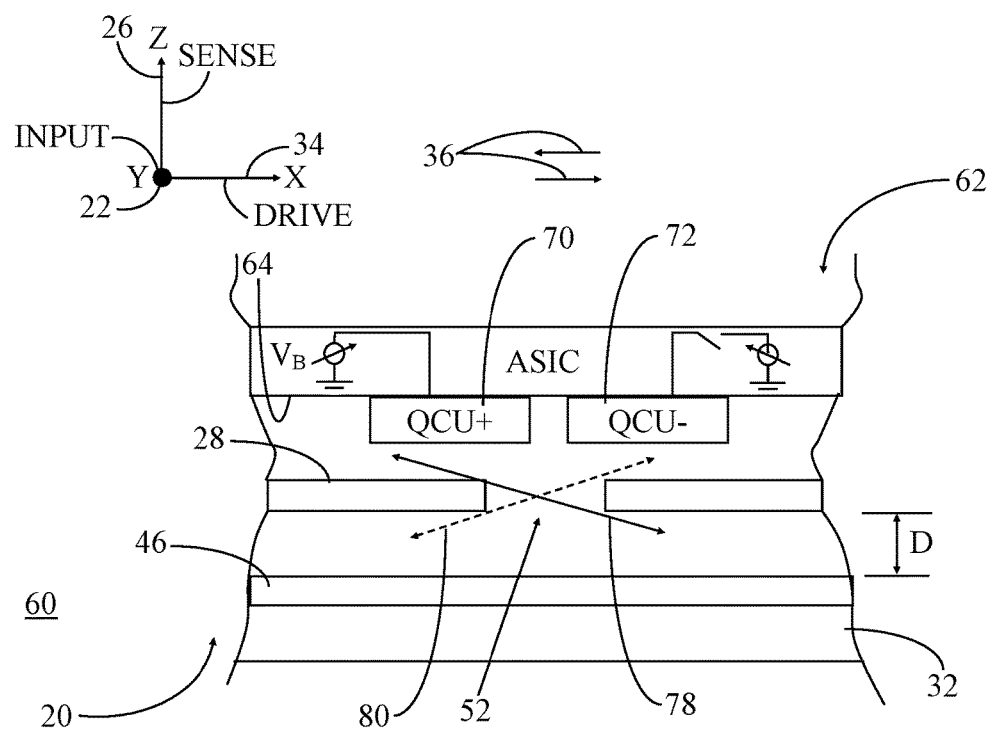
FIG. 3 shows a partial side view of the integrated device of FIG. 2.
Figure 4:
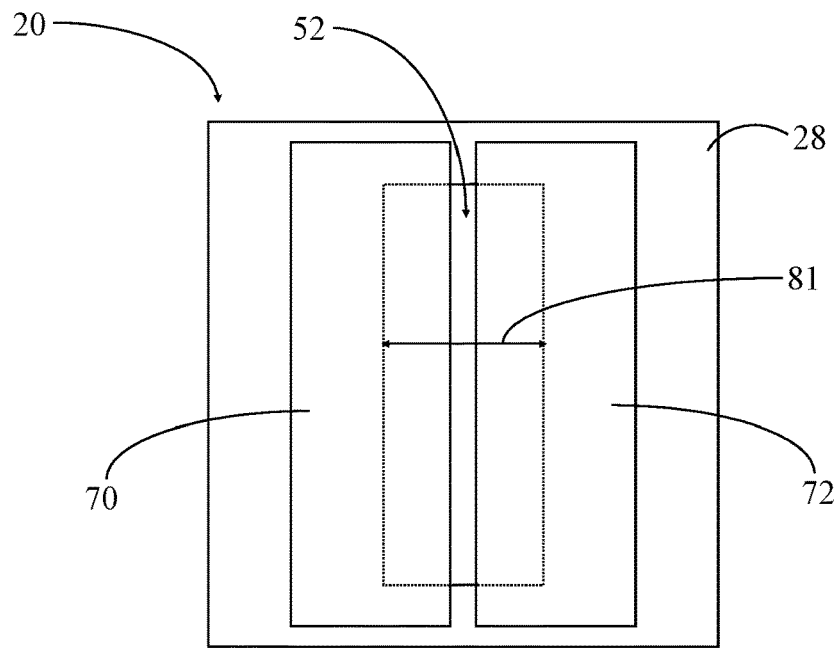
FIG. 4 shows a partial top view of a MEMS gyroscope.

Referring now to FIGS. 3 and 4 in connection with FIG. 2, FIG. 3 shows a partial side view of integrated device 60 and FIG. 4 shows a partial top view of gyroscope 20. By way of example, FIG. 3 shows a portion of first movable mass 28 with a single one of openings 52 extending through it and electrodes 70, 72 being vertically spaced apart from first movable mass 28 in proximity to opening 52. Likewise, FIG. 4 shows the same portion of first movable mass 28 as presented in FIG. 3 with one of openings 52 extending through it and electrodes 70, 72 positioned generally over opening 52. In this example, electrodes 70, 72 may be used for biasing first and second movable elements 28, 30 to reduce or null any possible quadrature motion of first and second movable elements 28, 30. Accordingly, electrodes 70, 72 are referred to herein as quadrature compensation electrodes 70, 72. Quadrature compensation electrode 70 is labeled QCU+ and quadrature compensation electrode 72 is labeled QCU- indicating that they may be differently biased, for example, opposite in polarity.

Ideally, first movable element 28 should be driven to oscillate in a manner that is substantially parallel to sense electrode 46 such that a nominal distance, D, between the oscillating mass 28 and sense electrode 46 only varies in response to changes in Coriolis force. However, manufacturing imperfections can also cause out-of-plane quadrature motion, as indicated generally by a solid arrow 78. This out-of-plane quadrature motion 78 can cause the nominal distance, D, between the oscillating mass 28 and sense electrode 46 to vary. Since sense signal 50 (FIG. 1) is dependent upon the distance, D, any changes in distance, D, resulting from quadrature motion 78 will be injected into sense signal 50, reducing the ability of gyroscope 20 to accurately sense small changes in Coriolis force.

To counterbalance quadrature motion 78, a constant voltage bias $V_B$ may be applied to quadrature compensation electrode 70 while quadrature compensation electrode 72 may be kept at the same potential as first movable mass 28. As such, quadrature compensation electrode 72 would provide no interaction with first movable mass 28 in this example. The constant voltage bias $V_B$ will produce an electrostatic force between quadrature compensation electrode 70 and first movable mass 28 resulting in quadrature compensation motion, as indicated generally by a dashed arrow 80. In this example, as movable mass 28 moves rightwardly, the overlap area with quadrature compensation electrode 70 will increase therefore increasing the vertical electrostatic force. As movable mass 28 moves leftwardly, the overlap area with quadrature compensation electrode 72 will decrease therefore decreasing the vertical electrostatic force. Ideally, this quadrature compensation motion 80 is approximately equal to and opposite quadrature motion 78 so as to substantially cancel quadrature motion 78.

In this theoretical configuration, two metal electrodes (e.g., quadrature compensation electrodes 70, 72 formed on surface 64 of IC die 62) are arranged to overlie opening 52 extending through first movable mass 28. When IC die 62 is subsequently bonded to gyroscope 20, a misalignment of the IC die 62 to gyroscope 20 bond could adversely affect the appropriate location of quadrature compensation electrodes 70, 72 relative to opening 52. In order to enable nominal operation in this theoretical configuration when there is no bond misalignment and with, for example, drive motion of +/- five microns, a width 81 of fourteen microns for opening 52 in movable mass 28 would be required. Some specifications allow +/- ten microns of bond misalignment. Accordingly, for +/- ten microns of bond misalignment, the width 81 of opening 52 needs to be thirty-four microns in order to maintain normal operation. This greater width of openings 52 decreases the sense area and therefore undesirably decreases the sensitivity of gyroscope 20.

Figure 5:
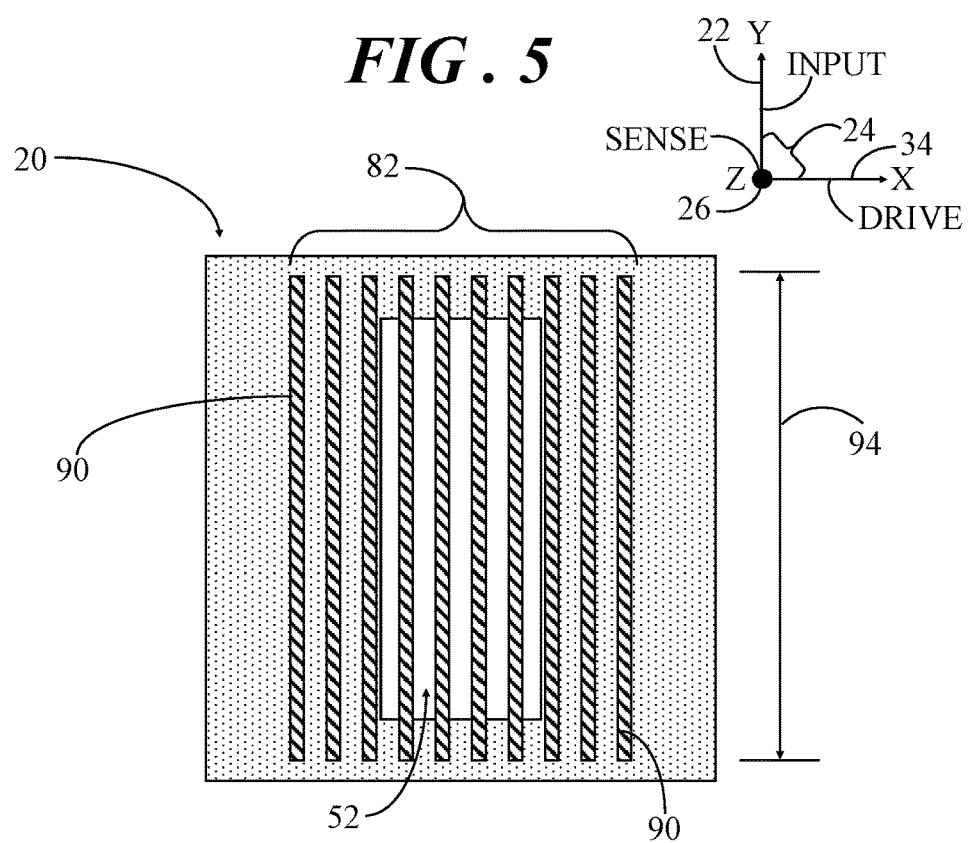
FIG. 5 shows a partial top view of the MEMS gyroscope of FIG. 1 in accordance with an embodiment.
Figure 6:
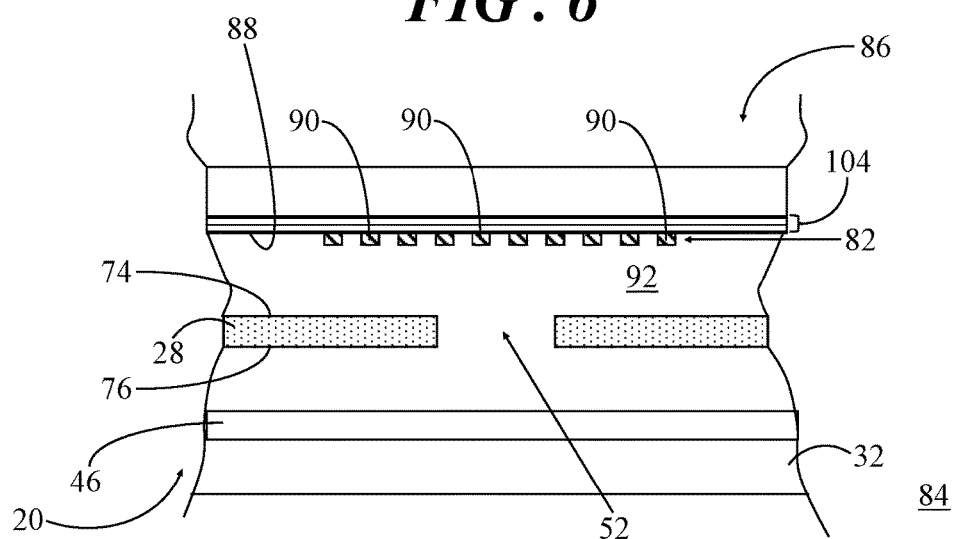
FIG. 6 shows a partial side view of an integrated device that includes the MEMS gyroscope of FIG. 1 and an electrode structure.

Referring now to FIGS. 5 and 6, FIG. 5 shows a partial top view of MEMS gyroscope 20 and an electrode structure 82 in accordance with an embodiment and FIG. 6 shows a partial side view of an integrated device 84 that includes gyroscope 20 coupled with an IC die 86 in accordance with an embodiment. Like the previous illustrations, IC die 86 has a surface 88 coupled with gyroscope 20 such that movable masses 28, 30 (FIG. 1) are interposed between substrate 32 and surface 88 of IC die 86. In this simplified illustration, FIGS. 5 and 6 only show a portion of first movable mass 28 with a single one of openings 52 extending through it, thus corresponding with FIGS. 3 and 4. However, it should be understood that the ensuing discussion applies equally to a structural configuration in which integrated device 84 includes the entire structure of gyroscope 20 described above. Further, first movable mass 28 is shown with stippling in order to better visualize opening 52 and in order to distinguish first movable mass 28 from the overlying electrode structure 82.

Electrode structure 82 is formed on surface 88 of IC die 86. In accordance with a particular embodiment, electrode structure 82 includes a plurality of electrode segments 90 (shown with rightwardly and downwardly directed wide hatching) vertically spaced apart from first side 74 of movable mass 28. Again, sense electrode 46 is formed on substrate 32 and is vertically spaced apart from second side 76 of first movable mass 28. Accordingly, first sense mass 28, electrode structure 82 having a plurality of electrode segments 90, and sense electrode 46 are enclosed within a cavity 92 formed by coupling IC die 86 with gyroscope 20 via, for example, spacer elements (not shown). Again, such a configuration can achieve significant space savings and a reduced size relative to configurations in which all electrodes (i.e., both sense and quadrature compensation electrodes) may be laterally disposed adjacent to one another and positioned on the same side of the movable mass(es). In a non-limiting embodiment, electrode segments 90 function as quadrature compensation electrodes in lieu of quadrature compensation electrodes 70, 72. However, electrode segments 90 may serve as sense electrodes in alternative embodiments.

Electrode segments 90 are suitably formed on surface 88 of IC die 86 and overlie opening 52. Additionally, each of electrode segments 90 has a lengthwise dimension 94 that is oriented approximately perpendicular to the drive direction, where the drive direction is substantially parallel to drive axis 34. Further, lengthwise dimension 94 of electrode segments 90 is approximately parallel to input axis 22. Of course, in consideration of the entire structure, electrode segments 90 are suitably configured on surface 88 to overlie at least one each of openings 52, 54 (FIG. 1) of each of first and second movable masses 28, 30 (FIG. 1).

Figure 7:
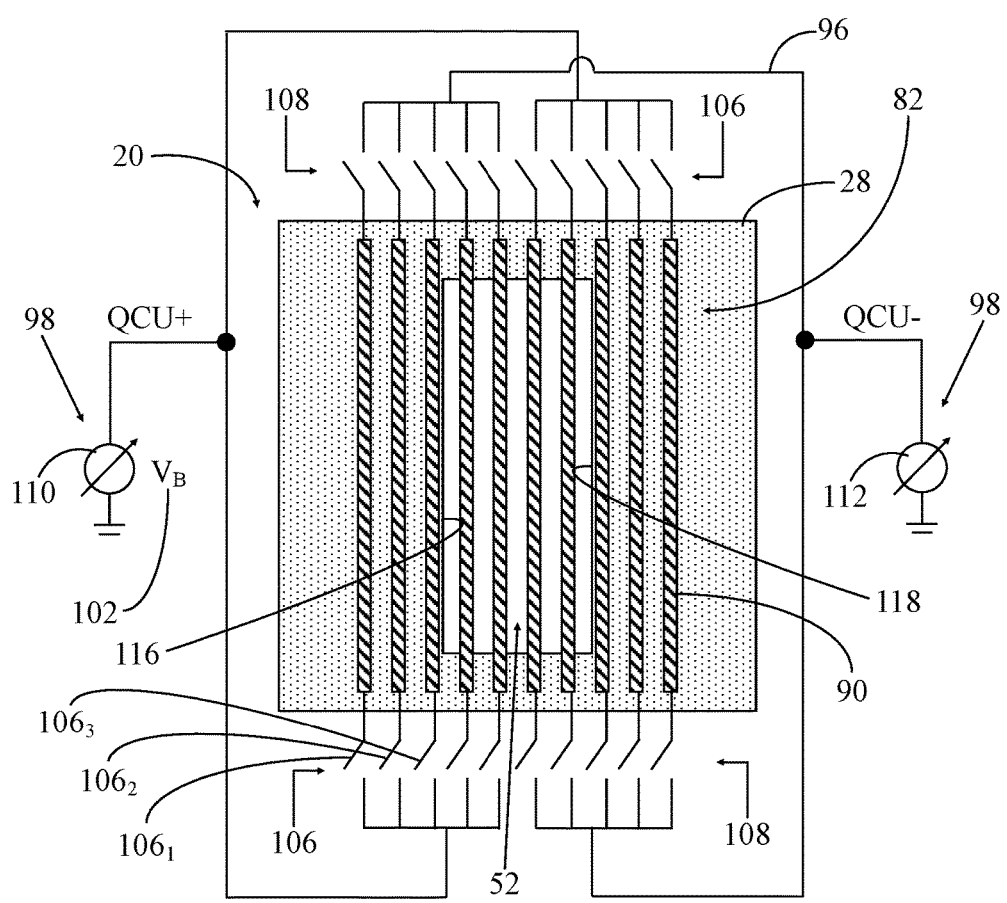
FIG. 7 shows a partial top view of the MEMS gyroscope and the electrode structure of FIG. 6 along with a switch structure and associated control circuitry.

With reference now to FIGS. 5, 6, and 7, FIG. 7 shows a partial top view of the gyroscope 20 and electrode structure 82, along with a switch structure 96 and control circuitry 98 simplistically represented by voltage source symbols. More particularly, FIG. 7 shows only a portion of first movable mass 28 with a single one of openings 52 extending through it, thus corresponding with FIGS. 3-6. Control circuitry 98 is configured to provide a bias voltage, referred to alternatively as a quadrature compensation voltage $V_B$ 102. Each of electrode segments 90 can be selectively connected to control circuitry 98 via switch structure 96 in order to apply quadrature compensation voltage 102 to the selected ones of electrode segments 90.

The electrical interconnects and switches of switch structure 96 may be suitably formed in one or more routing layers 104 (see FIG. 6) of IC die 86, and each of electrode segments 90 is individually interconnectable with switch structure 96 as represented by individual switches 106, 108, wherein one of the pair of switches 106, 108 can be closed to connect their associated electrode segment 90 to either a positive DC voltage source (QCU+) 110 or a negative DC voltage source (QCU−) 112. Thus, switch structure 96 enables selective connection of individual electrode segments 90 to control circuitry 98.

The design of electrode structure 82 on surface 88 of IC die 86 facing moveable mass 28 can be subdivided into regions, i.e., subsets of electrode segments 90 via switch structure 96. As will be discussed below, these subsets of electrode segments 90 can be connected through routing layers 104 in IC die 86 to switches 106, 108 and control circuitry 98. Control circuitry 98 can then be used to activate or deactivate regions or subsets of electrode segments 90 to achieve advantageous interactions with gyroscope by applying, for example quadrature compensation voltage 102. The design of electrode segments 90 enables subsets of electrode segments 90 to be activated by control circuitry 98 to compensate for wafer bond misalignments between IC die and gyroscope 20. Alternatively, or additionally, the subsets of electrode segments 90 that are activated by control circuitry 98 may be further subdivided to enable small incremental interaction force increases or decreases by switching bias levels, e.g., the magnitude of quadrature compensation voltage 102, on certain electrode segments 90.

A method of making integrated device 84 can entail providing a MEMS wafer having a plurality of gyroscopes 20 formed thereon and providing an CMOS wafer having a plurality of IC dies 86 formed thereon, wherein each of IC dies 86 has electrode structure 82 formed on surface 88 thereof. Further, each of IC dies 86 has routing for switch structure 96 formed in routing layers 104 of the CMOS wafer, and switches 106, 108 and control circuitry 98 are provided as part of each IC die 86. The CMOS wafer is coupled with the MEMS wafer to form a stacked structure that includes a plurality of integrated devices 84, as previously described. Thereafter, the stacked structure may be diced, sawn, or otherwise separated to yield integrated devices 84 utilizing conventional and upcoming wafer fabrication processes.

Figure 8:
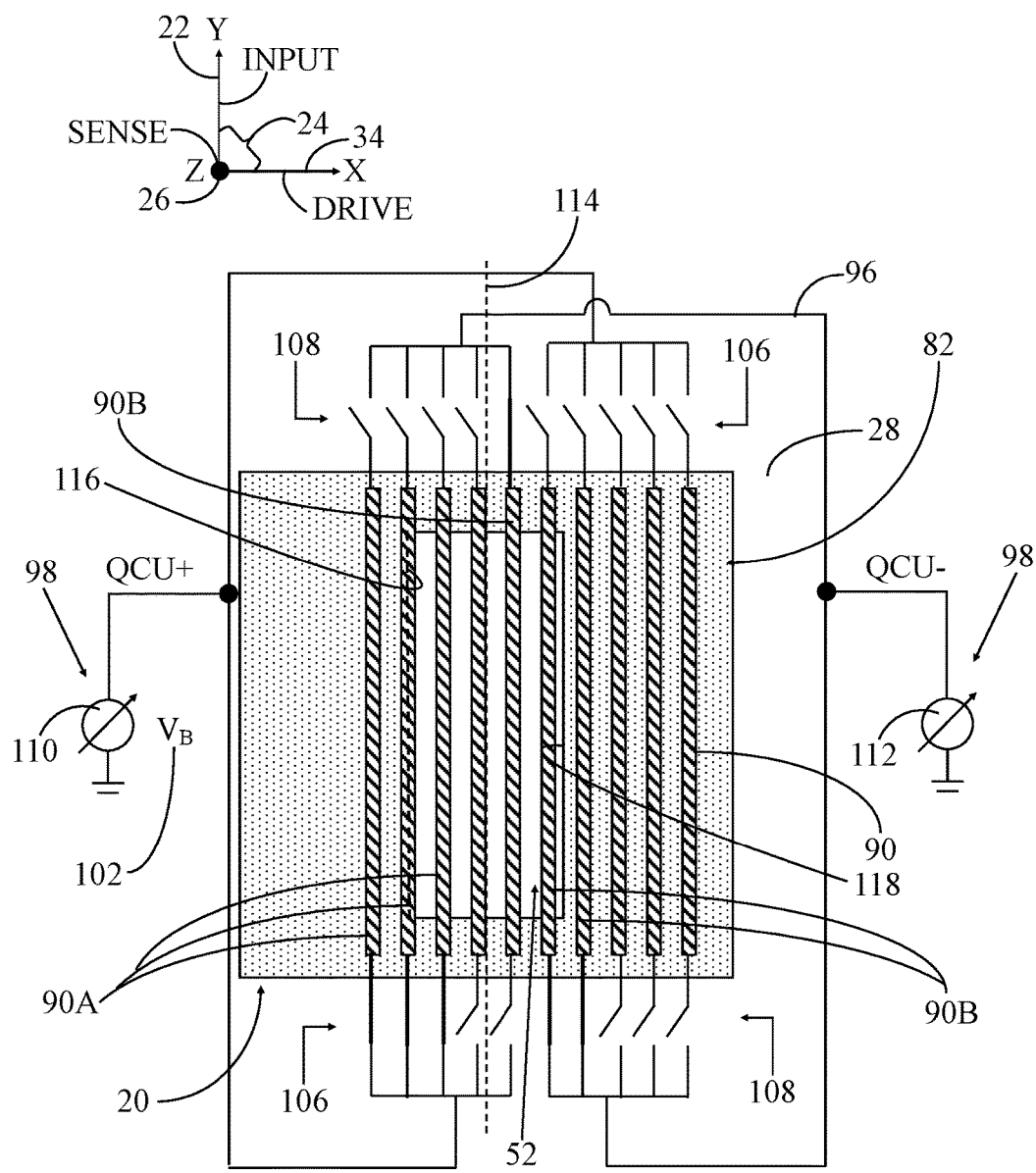
FIG. 8 shows a partial top view of the MEMS gyroscope and the electrode structure subject to displacement due to bond alignment mismatch.

FIG. 8 shows a partial top view of gyroscope 20 and electrode structure 82 subject to displacement due to bond alignment mismatch. A center of opening 52 is represented by a dashed line 114. If no bond alignment mismatch was present, half of electrode segments 90 would be disposed on one side of dashed line 114 and the other half of electrode segments 90 would be disposed on the opposing side of dashed line 114. In this example, when movable mass 28 is not subjected to oscillatory drive motion, gyroscope 20 (represented by the illustrated portion of first movable mass 28) is shifted leftwardly relative to electrode segments 90 of electrode structure 82 formed on surface 88 (FIG. 6) of IC die 86 (FIG. 6).

Nominal operation of gyroscope 20 with quadrature motion compensation entails applying the bias voltage (e.g., quadrature compensation voltage 102) to those electrode segments 90 that will cross opposing edges 116, 118 (see also FIG. 7) of opening 52 as first movable mass 28 oscillates. Edge 116 is obscured by one of electrode segments 90. Hence, edge 116 it is represented by a dashed line in FIG. 8, but is visible in FIG. 7. Accordingly, in this example, switches 106 for a first subset, labeled 90A, of electrode segments 90 that will cross edge 116 as first movable mass 28 oscillates are closed so that a constant bias voltage (e.g., quadrature compensation voltage 102) is provided between electrode segments 90A and first movable mass 28. Conversely, switches 108 for a second subset, labeled 90B, of electrode segments 90 that will cross edge 118 as first movable mass 28 oscillates may be closed to so as to set electrode segments 90B to the same potential as first movable mass 28. Therefore, electrode segments 90B would have no interaction with first movable mass 28. In another embodiment, a suitable constant bias voltage (e.g., quadrature compensation voltage 102) may be provided between electrode segments 90B and first movable mass 28. As such, electrode segments 90A would be set to the same potential as first movable mass 28 so that they would have no interaction with first movable mass 28.

Thus, electrode segments 90A serve as positive quadrature compensation electrodes and electrode quadrature compensation segments 90B serve as negative electrodes in this example. Depending upon where the bond alignment (or misalignment) takes place, various electrode segments 90 can be switched on to make either the positive quadrature compensation electrode or the negative quadrature compensation electrode. The configuration of switch structure 96 allows for independent control of switches 106, 108 in order to produce either the positive or the negative quadrature compensation electrode (QCU+/QCU−).

Accordingly, quadrature compensation voltage 102 may be applied to a first quantity of electrode segments 90, e.g., three electrode segments 90A of electrode structure 82, where the quantity is less than the total quantity of electrode segments. Additionally, an overlap area of electrode segments 90A and electrode segments 90B overlying opening 52 changes (i.e., increases and decreases) as movable mass oscillates relative to drive axis 34. This quadrature compensation voltage 102 thus produces an electrostatic force between electrode segments 90A and movable mass 28 that can reduce or null quadrature motion of first movable mass 28.

An example process for determining which electrode segments 90 might be selected for quadrature motion compensation will be discussed in connection with FIG. 10. Additionally, an example quadrature error compensation process implementing electrode structure will be discussed in connection with FIG. 11.

Figure 9:
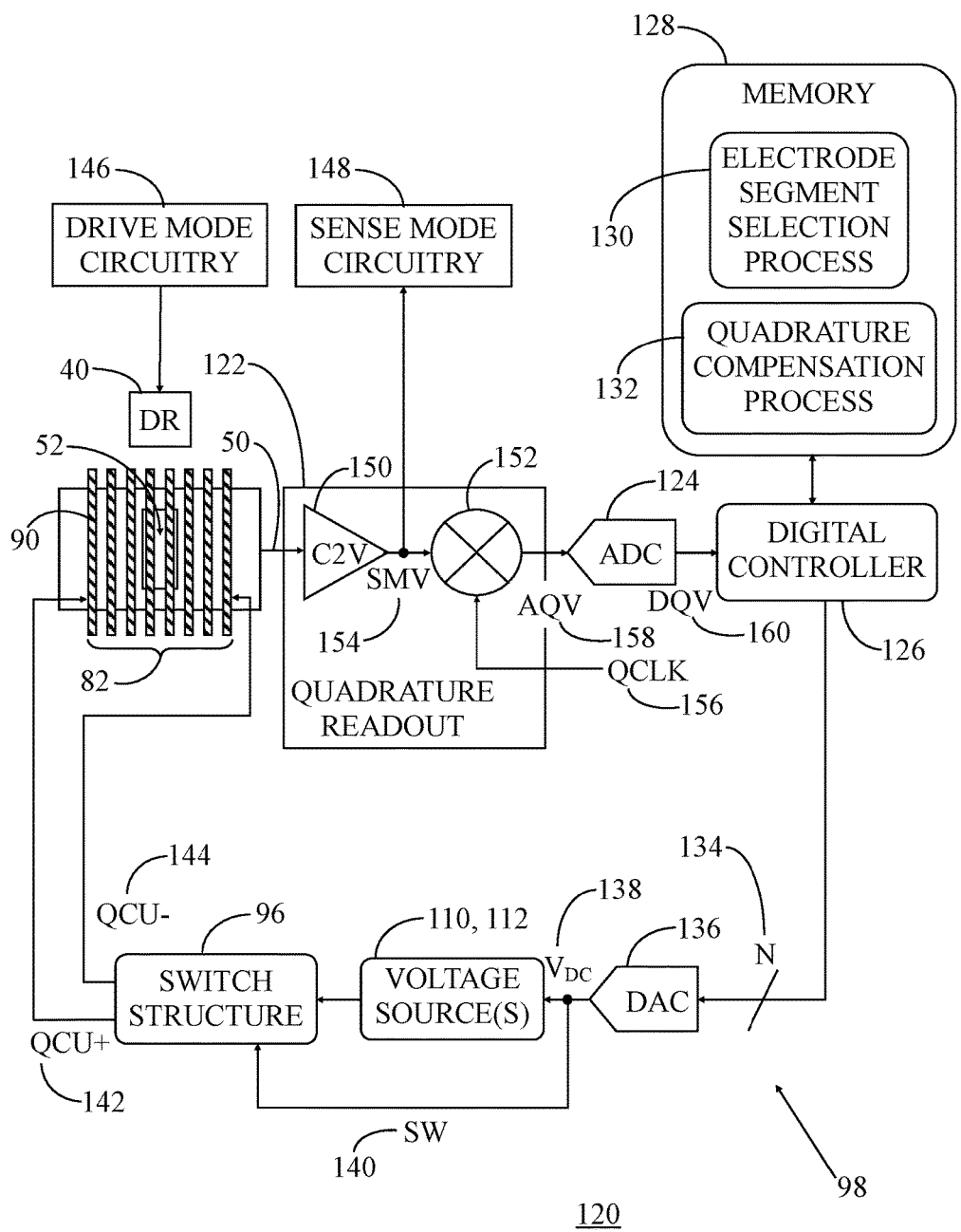
FIG. 9 shows a block diagram of a quadrature compensation system utilizing the electrode structure.

Referring to FIGS. 1, 7 and 9, FIG. 9 shows a block diagram of a quadrature compensation system 120 utilizing electrode structure 82. More particularly, quadrature compensation system 120 may include electrode structure 82 having electrode segments 90 in proximity to openings 52, 54 of movable masses 28, 30 of gyroscope 20 as discussed above. For simplicity of illustration only a portion of movable mass 28 is illustrated with electrode segments 90 overlying a single opening 52 to correspond with the illustrations of FIGS. 5-8. In one example, quadrature compensation system 120 may be implemented within IC die 86 (FIG. 6) to yield a compact form factor.

Quadrature compensation system 120 additionally includes active control circuitry 98 in the form of, for example, a quadrature readout block 122 for receiving sense signal 50 output from gyroscope 20. Quadrature readout block 122 is in communication with an analog-to-digital converter (ADC) 124 which, in turn, is in communication with a digital controller 126. Digital controller 126 may have a memory element 128 in association therewith for storage of, by way of example, an electrode segment selection process 130 and a quadrature compensation process 132. One example of electrode segment selection process 130 will be discussed in connection with FIG. 10 and one example of quadrature compensation process 132 will be discussed in connection with FIG. 11. Digital controller 126 outputs digital control signals, N, 134 to a digital-to-analog converter (DAC) 136. DAC 136 converts digital control signals 134 to analog signals and communicates analog voltage control signals ($V_{DC}$) 138 to positive and/or negative quadrature DC voltage source(s) 110, 112. Additionally, DAC 136 may communicate analog switch control signals (SW) 140 to switch structure 96. Thereafter, quadrature control signals, e.g., a positive DC voltage (QCU+) 142 may be provided to a subset of electrode segments 90 while another subset of electrode segments 90 may be held at the same potential as movable mass 28 (represented by QCU− 144).

Those skilled in the art will recognize that the circuitry associated with gyroscope 20 can additionally include drive-mode circuitry 146 and sense-mode circuitry 148. The elements of drive-mode circuitry 146 and/or sense-mode circuitry 148 may be shared with or may be provided separately from quadrature compensation system 120. Each of drive-mode circuitry 146 and sense-mode circuitry 148 are simply represented by boxes in FIG. 9 and will not be described in detail herein so as to not unnecessarily obscure the features of quadrature compensation system 120.

Quadrature readout block 122 includes a capacitance-to-voltage (C2V) unit 150 and a quadrature sampler 152. Capacitance-to-voltage unit 150 is connected to, for example, sense electrodes 46, 48 (FIG. 1) of a sense measurement unit (not shown) and is arranged to provide a measure of the capacitance between movable masses 28, 30 and sense electrodes 46, 48 (e.g., sense signal 50) as a sense measurement voltage signal (SMV) 154. In this example, sense measurement voltage signal 154 is indicative of a displacement of movable masses 28, 30 along sense axis 26 (i.e., the Z-axis). Such displacement may be associated with the Coriolis force induced by an angular rotation rate about input axis 22 (i.e., the Y-axis).

Quadrature sampler 152 may be connected to a clock sampler (not shown) to receive a digital signal as a quadrature sample clock (QCLK) 156. Quadrature sampler 152 is configured to receive sense measurement voltage signal 154 from capacitance-to-voltage unit 150. Quadrature sampler 152 is arranged to sample sense measurement voltage signal 154 with quadrature sample clock 156 to obtain analog quadrature sample values (AQV) 158. Analog quadrature sample values 158 can be an analog measure. As such, ADC 124 is arranged to convert quadrature sense sample values 158 into a digital quadrature values (DQV) 160. Digital controller 126 is configured to receive digital quadrature values 160 in order to perform electrode segment selection process 130 (FIG. 10) and or quadrature compensation process 132 (FIG. 11) and provide, for example, control signals 134. The architecture of quadrature compensation system 120 depicted herein is merely illustrative. Those skilled in the art will recognize that many other architectures may be implemented for control circuitry 98 of quadrature compensation system 120 which achieve the same functionality of providing quadrature compensation.

Figure 10:
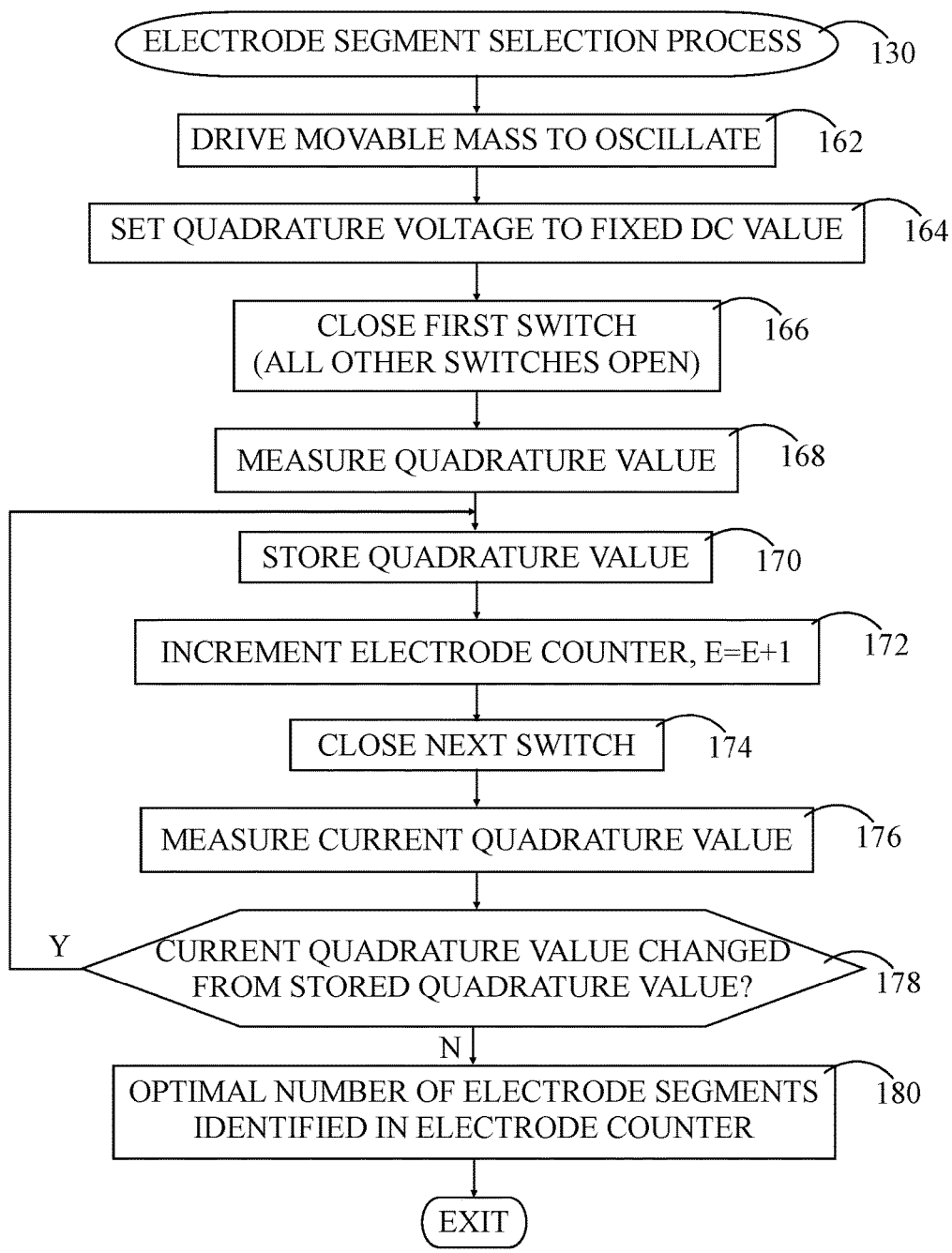
FIG. 10 shows a flowchart of an electrode segment selection process.

Referring to FIGS. 1, 7, and 10, FIG. 10 shows a flowchart of electrode segment selection process 130 that may be executed by digital controller 126 (FIG. 9) of quadrature compensation system 120 (FIG. 9). More particularly, electrode segment selection process 130 may be executed to determine which switches 106, 108 should be closed in order to select a subset of electrode segments 90 as QCU+ electrodes (e.g., electrode segments 90A) and to select another subset of electrode segments 90 as QCU− electrodes (e.g., electrode segments 90B). That is, in order to compensate for quadrature motion, the bias voltage (e.g., quadrature compensation voltage 102 of FIG. 7) should be applied to those electrode segments 90 that will cross opposing edges 116, 118 of opening 52 as first movable mass 28 oscillates. Execution of electrode segment selection process 130 is not intended to remove existing quadrature motion. Rather, the objective of electrode segment selection process 130 is to find the optimal number of electrode segments 90 to be activated. Once the optimal number of electrode segments 90 is discovered, the bias voltage can be set on them such that the quadrature motion is reduced or nulled. Again, the ensuing discussion refers to electrode segments 90 associated with first movable mass 28 and a single one of openings 52. It should be understood, however, the discussion applies equivalently electrode segments 90 associated with the multiple openings 52 of first movable mass 28 and to electrode segments 90 associated with multiple openings 54 of second movable mass 30 (FIG. 1).

At a block 162 of electrode segment selection process 130, first movable mass 28 is driven to oscillate relative to drive axis 34. At a block 164, a quadrature voltage is set to a fixed DC value. That is, positive DC voltage source 110 is set to some predetermined DC value such that there is a bias or differential to the voltage set on first movable mass 28. At a block 166, a first switch of switch structure 96 is closed while all of the remaining switches are open. Referring particularly to FIG. 7, a first switch 106, labeled $106_1$, may be closed. Thus, the fixed DC quadrature voltage is applied to first switch $106_1$.

Next at a block 168, a quadrature value is measured. Since an angular velocity about input axis 22 is not being imposed on gyroscope 20, the quadrature value is generally the amplitude of sense signal 50 in phase with the drive signal. The measured quadrature value is at least temporarily stored or otherwise saved at a block 170. At a block 172, an electrode segment counter may by incremented, E=E+1, in order to maintain a count of the selected electrode segments 90. Of course, during a first iteration of electrode segment selection process 130 the total number of electrode segments 90 counted by the electrode segment counter will be E=1.

At a block 174, the next switch of switch structure 96 is closed. The next switch may be associated with the electrode segment immediately adjacent to the first electrode segment 90 that was activated. Referring particularly to FIG. 7, the "next" switch 106, labeled $106_2$, may be closed. At a block 176, the current quadrature value (i.e., the amplitude of sense signal 50 in phase with the drive signal) is measured. At a query block 178, a determination is made as to whether the current quadrature value (measured at block 176) has changed (i.e., increased or decreased) since its starting value stored at block 170. In some scenarios, "change" may be detected when the current quadrature value exceeds some threshold value relative to the stored quadrature value. If the current quadrature value changes relative to the stored quadrature value, process control loops back to block 170 to store the most recent quadrature value, to increment the electrode counter at block 172, and to thereafter close the next switch (labeled 106$_3$) in FIG. 7. Conversely, if the current quadrature value has not changed significantly from the previously stored quadrature value, a block 180 concludes that the optimal number of electrode segments 90 has been discovered. This optimal number can be the quantity stored in the electrode counter at block 172. Thereafter, process 130 ends.

Electrode segment selection process 130 is described in connection with determining the number of electrode segments 90 that may be designated as the QCU+ electrode upon which a positive DC bias voltage (e.g., quadrature compensation voltage 102 of FIG. 7) is to be applied in order to compensate for quadrature motion. Electrode segment selection process 130 may be repeated to determine the number of electrode segments 90 that may be designated as the QCU− electrode which are to be set to the same potential as first movable mass 28. The repeated execution of electrode segment selection process 130 may entail successively closing switches 108 to determine the number of electrode segments 90 that may be designated as the QCU− electrode. Further, additional processing may be performed to potentially "deselect" electrode segments 90 that do not contribute significantly to quadrature motion compensation. Referring briefly to the example presented in FIG. 8, when electrode segments 90 are misaligned relative to opening 52, the rightmost electrode segments 90 may not contribute significantly to quadrature motion compensation since they would not cross edge 118. Therefore, in some embodiments, switch elements 108 associated with these electrode segments 90 may be opened.

Figure 11:
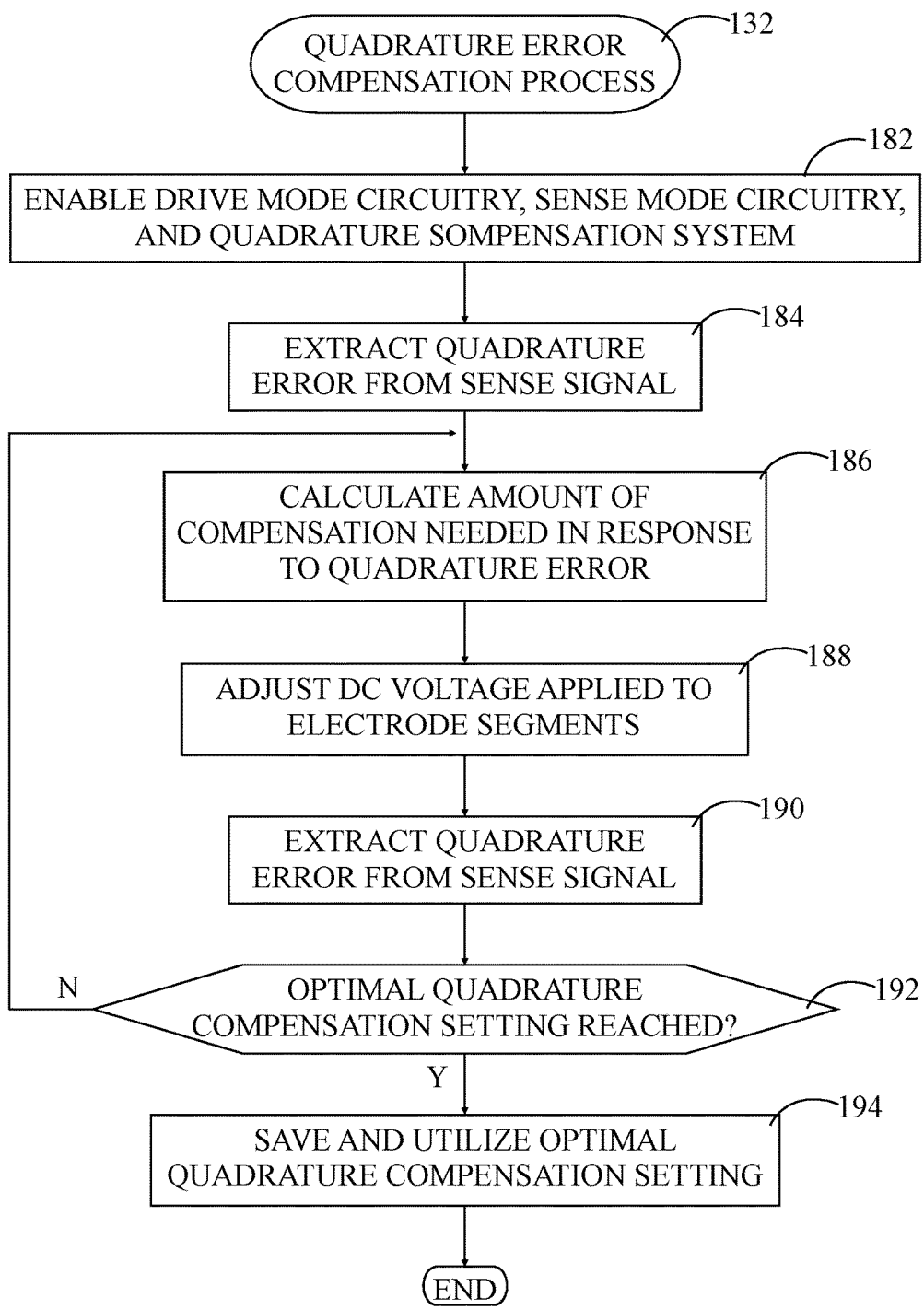
FIG. 11 shows a flowchart of a quadrature error compensation process.

Referring now to FIGS. 9 and 11, FIG. 11 shows a flowchart of quadrature error compensation process 132. Process 132 may be executed by digital controller 126 of quadrature compensation system 120 to reduce or null quadrature motion of gyroscope 20 of integrated device 84 (FIG. 6).

At a block 182, drive mode circuitry 146, sense mode circuitry 148, and quadrature compensation system 120 are enabled. Thereafter, at a block 184, quadrature error is extracted from sense measurement voltage signal 154 which is a voltage representative of sense signal 50. At a block 186, digital controller 126 calculates an amount of compensation that may be needed in response to receipt of digital quadrature values 160. At a block 188, the DC voltage applied to the QCU+ electrode segments 90 and the QCU− electrode segments 90 is adjusted. The DC voltage applied to the selected electrode segments 90 is configured to modulate a magnitude of an electrostatic force applied to first and second movable masses 28, 30 (FIG. 1) to reduce quadrature motion of first and second movable masses 28, 30.

At a block 190, quadrature error is again extracted from sense measurement voltage signal 154. At a query block 192, a determination is made as to whether an optimal quadrature compensation setting has been reached. In other words, a determination is made at query block 192 that quadrature motion has been sufficiently reduced or completely nulled. When an optimal quadrature compensation setting has not been reached, process control loops back to block 186 to again calculate the amount of compensation needed in response to the extracted quadrature error. Thus, process control provides feedback control in order to converge to the optimal voltage bias applied to the selected electrode segments that gives the lowest possible level of quadrature error. When a determination is made at query block 192 that quadrature motion has been sufficiently reduced or completely nulled, the optimal quadrature compensation setting (DC bias voltage) is saved and utilized for quadrature compensation. Thereafter, quadrature error compensation process 132 ends. Of course, in some configurations, process 132 may be periodically repeated to ascertain that the saved quadrature compensation setting remains optimal.

It is to be understood that certain ones of the process blocks depicted in FIGS. 10-11 may be performed in parallel with each other or with performing other processes. In addition, it is to be understood that the particular ordering of the process blocks depicted in FIGS. 10-11 may be modified, while achieving substantially the same result. Accordingly, such modifications are intended to be included within the scope of the inventive subject matter.

Thus, an integrated device and methodology for fabricating the integrated device have been described. An embodiment of an integrated device comprises a microelectromechanical systems (MEMS) device having a movable mass spaced apart from a substrate, the movable mass being configured to oscillate in a drive direction relative to the substrate. The integrated device further comprises an integrated circuit (IC) die having a surface coupled with the MEMS device such that the movable mass is interposed between the substrate and the surface of the IC die, and an electrode structure formed on the surface of the IC die, the electrode structure including a plurality of electrode segments vertically spaced apart from the movable mass.

An embodiment of a method for making an integrated device comprises providing a microelectromechanical systems (MEMS) device having a movable mass spaced apart from a substrate, the movable mass being configured to oscillate in a drive direction relative to the substrate. The method further comprises providing an integrated circuit (IC) die having a surface, providing an electrode structure on the surface of the IC die, the electrode structure including a plurality of electrode segments, and coupling the surface of the IC die with the MEMS device such that the movable mass and the electrode structure are enclosed within a cavity formed by the coupling of the integrated circuit die with the MEMS device, and the plurality of electrode segments is vertically spaced apart from the movable mass.

An embodiment of a system comprises an integrated device comprising a microelectromechanical systems (MEMS) gyroscope having a movable mass spaced apart from a substrate, the movable mass being configured to oscillate in a drive direction relative to the substrate. The integrated device further comprises an integrated circuit (IC) die having a surface coupled with the MEMS device such that the movable mass is interposed between the substrate and the surface of the IC die, and an electrode structure formed on the surface of the IC die, the electrode structure including a plurality of electrode segments vertically spaced apart from the movable mass. The system further comprises control circuitry for providing a quadrature compensation voltage, wherein each of the plurality of electrode segments is selectively connected to the control circuitry in order to apply the quadrature compensation voltage to selected ones of the electrode segments, the quadrature compensation voltage being configured to modulate a magnitude of an electrostatic force applied to the movable element to reduce quadrature motion of the movable mass.

Accordingly, embodiments entail an integrated device that includes a MEMS device vertically bonded with an IC die, such as a CMOS die, and fabrication methodology for producing the integrated device. An electrode structure is formed on a surface of the IC die facing a movable mass of the MEMS device, for example, a MEMS gyroscope. The electrode structure includes a plurality of electrode segments that are connected through routing layers on the CMOS die to a switch structure and an active circuit. The active circuit can be used to selectively activate or deactivate particular electrode segments to achieve advantageous interaction with the movable mass of the MEMS device. That is, the electrode segments can be used to apply electrostatic forces to the movable mass of the MEMS device in order to compensate for quadrature motion. Further, particular electrode segments can be activated in order to compensate for bonding misalignments between the IC die and the MEMS device. Still further, the electrode segments may be selectively activated in order to allow incremental electrostatic force increases or decreases by switching voltage bias levels on the electrode segments via the active circuit.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

The invention claimed is:

1. An integrated device comprising:
    a gyroscope that includes a movable mass and a substrate, said movable mass being spaced apart from said substrate, said movable mass being configured to oscillate in a drive direction relative to said substrate;
    an integrated circuit (IC) die having a surface coupled with said substrate of said gyroscope such that said movable mass is interposed between said substrate and said surface of said IC die; and
    an electrode structure formed on said surface of said IC die, said electrode structure including a plurality of electrode segments vertically spaced apart from said movable mass, wherein a quadrature compensation voltage applied to at least a portion of said electrode segments is configured to modulate a magnitude of an electrostatic force applied to said movable mass to reduce quadrature motion of said movable mass.

2. The integrated device of claim 1, wherein said movable mass and said electrode structure are enclosed within a cavity formed by coupling said integrated circuit die with said gyroscope.

3. The integrated device of claim 1, wherein said plurality of electrode segments are vertically spaced apart from a first side of said movable mass, and said gyroscope further comprises a sense electrode formed on said substrate and vertically spaced apart from a second side of said movable mass, said second side opposing said first side.

4. The integrated device of claim 1, wherein said movable mass includes at least one opening extending through and fully encircled by said movable mass, and at least a portion of said electrode segments overlies said at least one opening.

5. The integrated device of claim 1, wherein each of said plurality of electrode segments has a longitudinal dimension that is oriented approximately perpendicular to said drive direction.

6. The integrated device of claim 1 further comprising control circuitry for providing said quadrature compensation voltage, wherein each of said plurality of electrode segments is selectively connected to said control circuitry in order to apply said quadrature compensation voltage to selected ones of said electrode segments.

7. The integrated device of claim 6 further comprising: a switch structure formed in one or more routing layers of said IC die, said each of said plurality electrode segments being individually interconnectable with said switch structure, and said switch structure enabling selective connection of individual ones of said electrode segments to said control circuitry.

8. The integrated device of claim 7, wherein a quantity of said electrode segments connected to said control circuitry via said switch structure is configured to modulate said magnitude of said electrostatic force applied to said movable mass in response to said applied quadrature compensation voltage.

9. The integrated device of claim 6, wherein said plurality of electrode segments comprises:
    a first subset of said electrode segments; and
    a second subset of said electrode segments laterally displaced away from said first subset of said electrode segments, wherein said quadrature compensation voltage is applied to said first subset of said electrode segments, and a voltage potential of said second set of said electrode segments is set to the same voltage potential as said movable mass.

10. The integrated device of claim 6, wherein said quadrature compensation voltage is applied to a first quantity of said electrode segments of said electrode structure, said first quantity being less than a total quantity of said electrode segments of said electrode structure.

11. A method for making an integrated device comprising:
    providing a gyroscope that includes a movable mass and a substrate, said movable mass being spaced apart from said substrate, said movable mass being configured to oscillate in a drive direction relative to said substrate;
    providing an integrated circuit (IC) die having a surface;
    providing an electrode structure on said surface of said IC die, said electrode structure including a plurality of electrode segments; and
    coupling said surface of said IC die with said substrate of said gyroscope such that said movable mass and said electrode structure are enclosed within a cavity formed by the coupling of said IC die with said substrate of said gyroscope, and said plurality of electrode segments is vertically spaced apart from said movable mass, wherein a quadrature compensation voltage applied to at least a portion of said electrode segments is configured to modulate a magnitude of an electrostatic force applied to said movable mass to reduce quadrature motion of said movable mass.

12. The method of claim 11, wherein said movable mass includes at least one opening extending through and fully encircled by said movable mass, and said forming said electrode structure includes arranging said plurality of electrode segments such that at least a portion of said electrode segments overlies said at least one opening.

13. The method of claim 12 further comprising:
providing control circuitry for applying said quadrature compensation voltage to said electrode structure; and
forming a switch structure in one or more routing layers of said IC die, each of said plurality of electrode segments being individually connectable with said switch structure, and said switch structure enabling selective connection of individual ones of said electrode segments to said control circuitry in order to apply said quadrature compensation voltage to connected ones of said electrode segments.

14. A system comprising:
an integrated device comprising:
  a gyroscope that includes a movable mass and a substrate, said movable mass being spaced apart from said substrate, said movable mass being configured to oscillate in a drive direction relative to said substrate;
  an integrated circuit (IC) die having a surface coupled with said substrate of said gyroscope such that said movable mass is interposed between said substrate and said surface of said IC die; and
  an electrode structure formed on said surface of said IC die, said electrode structure including a plurality of electrode segments vertically spaced apart from said movable mass; and
control circuitry for providing a quadrature compensation voltage, wherein each of said plurality of electrode segments is selectively connected to said control circuitry in order to apply said quadrature compensation voltage to selected ones of said electrode segments, said quadrature compensation voltage being configured to modulate a magnitude of an electrostatic force applied to said movable element to reduce quadrature motion of said movable mass.

15. The integrated device of claim 4 wherein an overlap area of said at least a portion of said electrode segments overlying said at least one opening changes as said movable mass oscillates in said drive direction.

16. The system of claim 14 wherein said movable mass includes at least one opening extending through and fully encircled by said movable mass, at least a portion of said electrode segments overlies said at least one opening, and an overlap area of said at least a portion of said electrode segments overlying said at least one opening changes as said movable mass oscillates in said drive direction.

17. The system of claim 16 further comprising a switch structure formed in one or more routing layers of said IC die, said each of said plurality electrode segments being individually interconnectable with said switch structure, and said switch structure enabling selective connection of individual ones of said electrode segments to said control circuitry.

18. The system of claim 17 wherein said plurality of electrode segments comprises:
  a first subset of said electrode segments; and
  a second subset of said electrode segments laterally displaced away from said first subset of said electrode segments, wherein said quadrature compensation voltage is applied to said first subset of said electrode segments, and a voltage potential of said second set of said electrode segments is set to the same voltage potential as said movable mass.

19. The system of claim 17 wherein said quadrature compensation voltage is applied to a first quantity of said electrode segments of said electrode structure, said first quantity being less than a total quantity of said electrode segments of said electrode structure.

* * * * *